United States Patent [19]

Kugo

[11] Patent Number: 5,727,301

[45] Date of Patent: Mar. 17, 1998

[54] ASSEMBLY SYSTEM FOR ASSEMBLING PRODUCT COMPRISING A PLURALITY OF PARTS

[75] Inventor: Daisaku Kugo, Nagaokakyo, Japan

[73] Assignee: Murata Manufacturing Co., Ltd., Japan

[21] Appl. No.: 643,071

[22] Filed: Apr. 30, 1996

Related U.S. Application Data

[62] Division of Ser. No. 221,403, Mar. 31, 1994, abandoned.

[30] Foreign Application Priority Data

Mar. 31, 1993 [JP] Japan .................................. 5-98501

[51] Int. Cl.$^6$ .................................................. B23P 11/00
[52] U.S. Cl. .................................. 29/430; 29/429; 29/787; 29/742; 29/784; 29/785; 29/792; 29/795; 29/822; 198/346.1
[58] Field of Search .................. 29/430, 429, 742, 29/771, 772, 783, 784, 785, 791, 787, 822, 795, 464; 198/346.1

[56] References Cited

U.S. PATENT DOCUMENTS

| | | | |
|---|---|---|---|
| 3,781,974 | 1/1974 | Hölzl et al. | 29/568 |
| 3,796,327 | 3/1974 | Meyer et al. | 198/346.1 |
| 4,209,898 | 7/1980 | Aoki et al. | 29/783 |
| 4,719,694 | 1/1988 | Herberich et al. | 29/703 |
| 4,722,653 | 2/1988 | Williams et al. | 414/222 |
| 4,783,904 | 11/1988 | Kimura | 29/786 |
| 4,815,190 | 3/1989 | Haba, Jr. et al. | 29/430 |
| 4,819,699 | 4/1989 | Brown et al. | 140/105 |
| 4,884,330 | 12/1989 | Sticht | 29/430 |
| 5,125,149 | 6/1992 | Inaba et al. | 29/430 |
| 5,224,813 | 7/1993 | Nakamura et al. | 198/346.1 |
| 5,237,736 | 8/1993 | Inoue et al. | 198/346.1 |
| 5,329,690 | 7/1994 | Tsuji et al. | 29/701 |
| 5,347,700 | 9/1994 | Tominaga et al. | 29/430 |
| 5,351,801 | 10/1994 | Markin et al. | 198/346.1 |
| 5,557,834 | 9/1996 | Miyanaka et al. | 29/888.06 |

FOREIGN PATENT DOCUMENTS

| | | |
|---|---|---|
| 0201262 | 12/1986 | European Pat. Off. |
| 0427243 | 5/1991 | European Pat. Off. |
| 5277856 | 10/1993 | Japan . |
| 2163118 | 2/1986 | United Kingdom . |
| 2212468 | 7/1989 | United Kingdom . |
| 9217047 | 10/1992 | WIPO . |

OTHER PUBLICATIONS

Great Britain Search Report dated Jul. 6, 1994.

*Primary Examiner*—Larry I. Schwartz
*Assistant Examiner*—Marc W. Butler
*Attorney, Agent, or Firm*—Ostrolenk, Faber, Gerb & Soffen, LLP

[57] ABSTRACT

An assembly system comprises a supply jig for holding and positioning a plurality of parts one by one, a supply center for inserting a plurality of parts into the supply jig, a plurality of assembly centers for taking out the parts from the supply jig and assembling the parts into products in parallel processing, carrier conveyor for carrying the supply jig from the supply center to the assembly centers and return conveyor for returning the supply jig from the assembly centers to the supply center. The supply jig supplies the common parts which are required in all of the assembly centers, while each of the assembly centers comprises individual supply means for supplying a non-common part. Thus, this system can cope with assembling various types of products simultaneously, and can eliminate line stoppage upon occurrence of a trouble or for periodic inspection in any one of the centers, thereby production capability is improved.

20 Claims, 20 Drawing Sheets

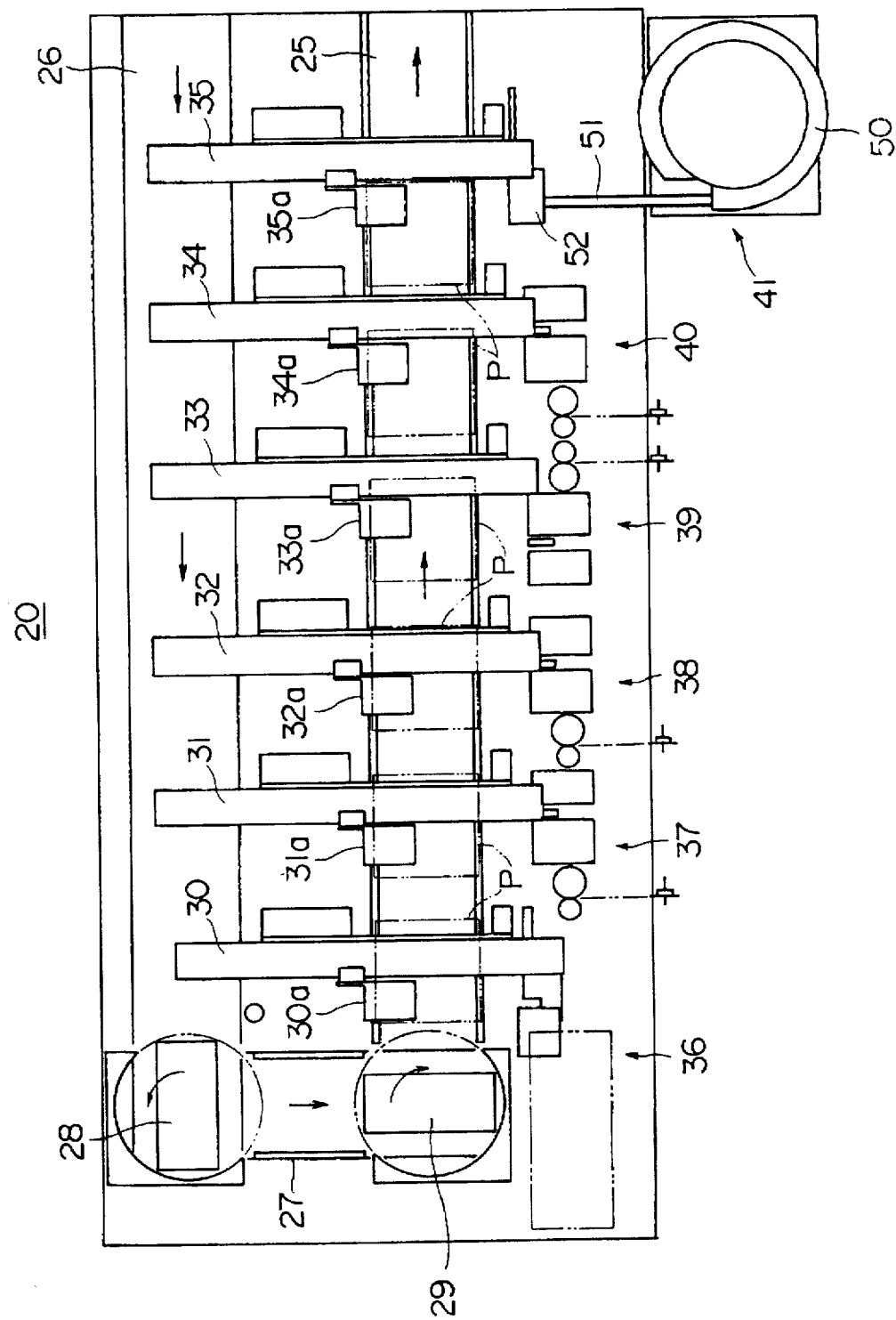

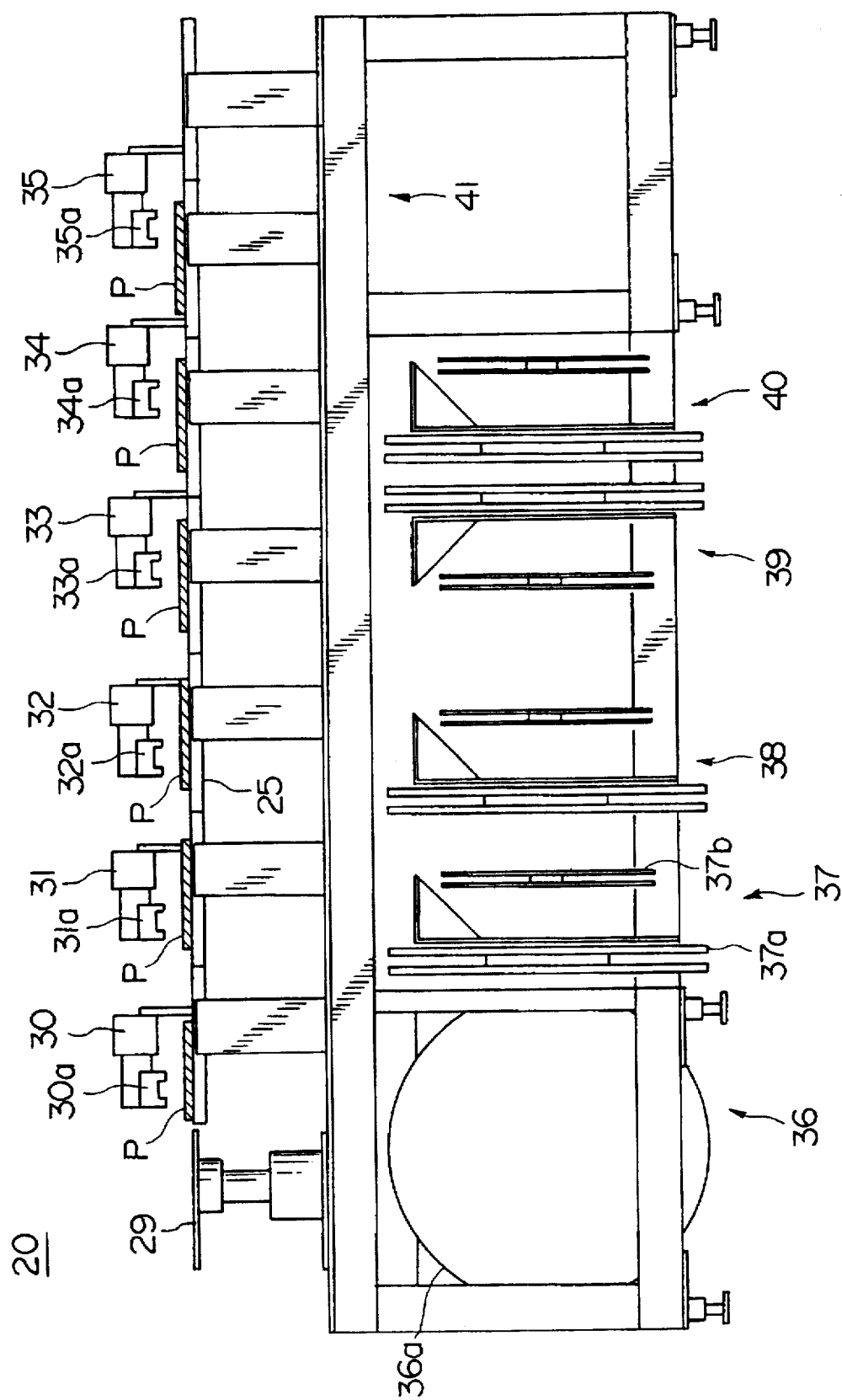

14
ASSEMBLY SYSTEM FOR ASSEMBLING PRODUCT COMPRISING A PLURALITY OF PARTS

RELATED APPLICATION

This is a division of application Ser. No. 08/221,403, filed Mar. 31, 1994 abandoned Jul. 10, 1996.

BACKGROUND OF THE INVENTION

The present invention relates to an assembly system for automatically assembling a product which comprises a plurality of parts. More specifically, this invention relates to an assembly system being suitable for assembling an electronic component such as a ladder-type filter.

FIGS. 1 and 2 show conventional assembly systems for automatically assembling such products.

FIG. 1 shows a line type assembly system, which is adapted to successively assemble parts A-E at respective assembling points 201-205 while carrying the parts or a conveyor 200 from "IN" to "OUT".

FIG. 2 shows a system of supplying all parts A-E to a single assembly center 220 so that the parts are assembled into a product therein.

Although the line type assembly system shown in FIG. 1 attains high production capability, since the parts are assembled while being transported by the conveyor, it is difficult to keep the parts in accurate positions and in stable attitude. Moreover, the production efficiency of this system is greatly reduced because the assembly line must be stopped even when only one assembling point is stopped upon occurrence of a problem or for periodic inspection. Further, this system is not flexible enough to perform assembling of various types of products.

The system shown in FIG. 2 is capable of assembling of various types of products. However, while one of the parts is being assembled, other parts cannot be supplied into the assembly center 220 at the same time, whereby this system has a low production capability.

Further, this system requires a large space since a plurality of supplying units for supplying the parts must be provided for each assembly center 220.

SUMMARY OF THE INVENTION

Accordingly, an advantage of the preferred embodiments of the present invention is to provide an assembly system which can assemble parts accurately and can attain high production capability.

Another advantage of the preferred embodiments of the present invention is to provide an assembly system which can eliminate decreased production efficiency caused by line stoppage upon occurrence of a problem or for periodic inspection.

Still another advantage of the preferred embodiments of the present invention is to provide an assembly system which can produce various types of products.

The assembly system according to the preferred embodiments of the present invention comprises a supply jig having a plurality of holding portions for holding a plurality of parts one by one, a supply center for inserting the parts in the holding portions of the supply jig, a plurality of assembly centers for removing the parts from the supply jig and assembling the parts into a product, and a carriage means for carrying the supply jig between the supply center and the assembly centers.

The supply jigs having received the parts in the supply center are carried to the respective assembly centers by the carriage, so that the parts are removed from the supply jigs and assembled into products at the assembly centers. At this time, it is possible to easily remove the respective parts, since the parts are independently positioned and held by the supply jig. The now vacated supply jigs are returned to the supply center by the carriage.

As hereinabove described, the parts are correctly positioned in the supply jig so as to be easily removed at the assembly centers, whereby a preliminary preparation for assembling can be carried out in the supply center to cope with assembling of complicated parts requiring high accuracy. As a result, neither a high-priced positioning mechanism nor a sensor is required in each of the assembly centers, whereby the assembly centers can be simplified in structure and reduced in cost. Further, it is not necessary to provide the respective assembly centers with a number of supply units, whereby the cost and the space can be saved. Moreover, since the assembly centers assemble the parts into products in parallel processing, the line is not stopped upon occurrence of a delay or malfunction for periodic inspection in any one of the centers, so production capability is improved.

In order to cope with simultaneous production of various types of products, common parts for all assembly centers may preferably be supplied by the supply jig while non-common parts may preferably be supplied by individual supply units provided in each of the assembly centers. In this case, only one type of supply jig is required since the supply jig supplies common parts alone, so the cost and the space can be saved.

Further, a new assembly center can be easily provided by simply coupling the new center to a rear end of a carriage.

The foregoing and other objects, features, aspects and advantages of the preferred embodiments of the present invention will become more apparent from the following detailed description of the present invention when taken in conjunction with the preferred embodiments of the accompanying drawings.

BRIEF DESCRIPTION OF THE DRAWINGS

FIG. 9A is a plan view of a supply center;

FIG. 9B is a front elevational view of the supply center shown in FIG. 9A;

3

Figure 12:
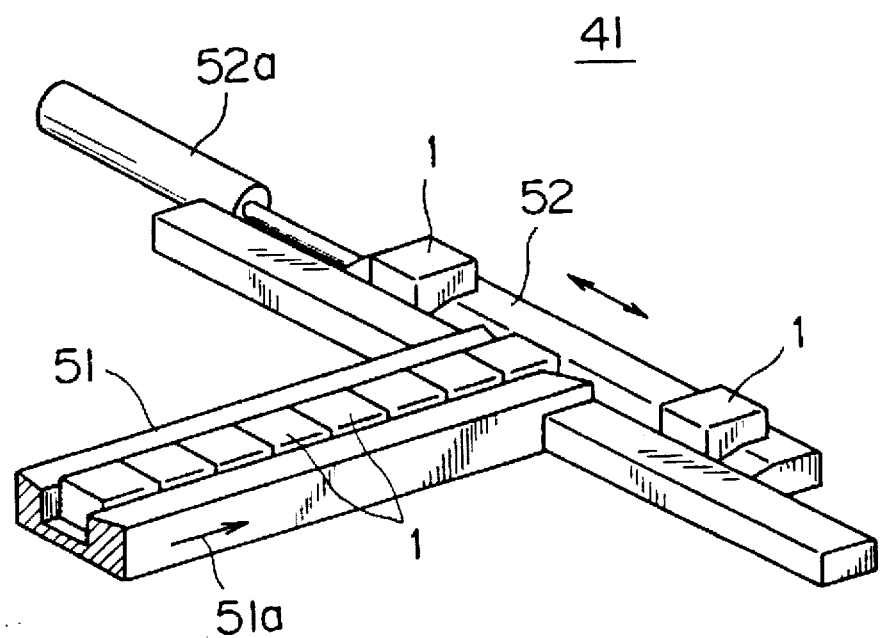
Figure 13:
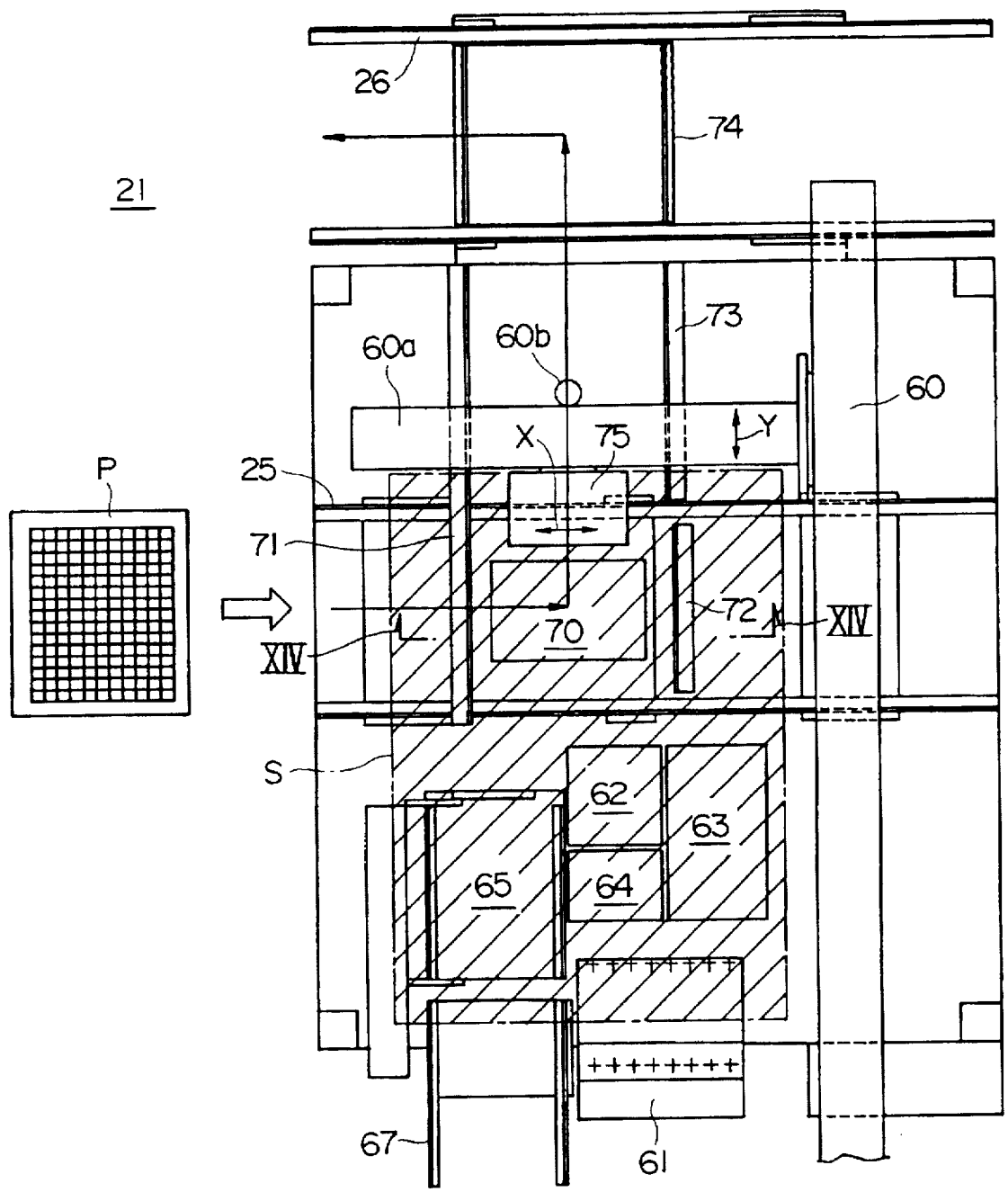
Figure 14A:
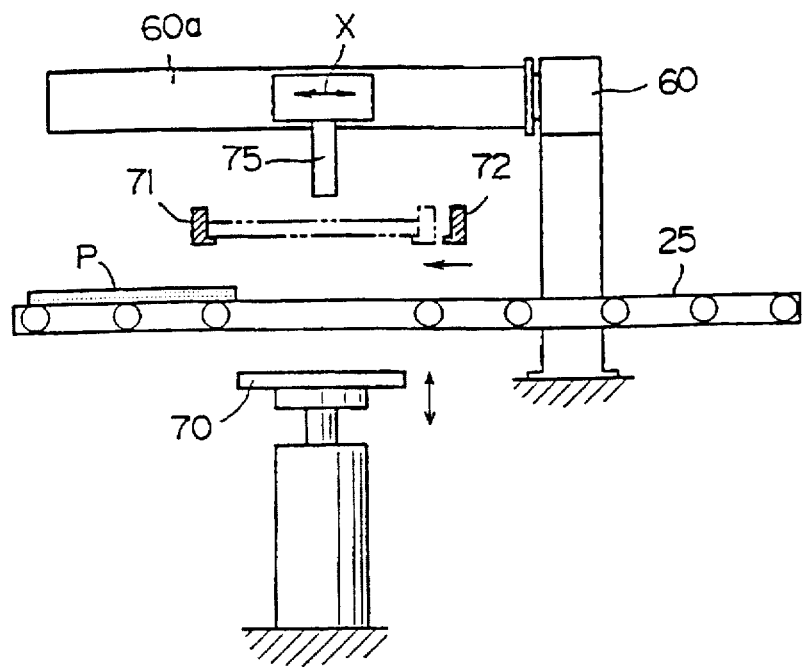
Figure 14B:
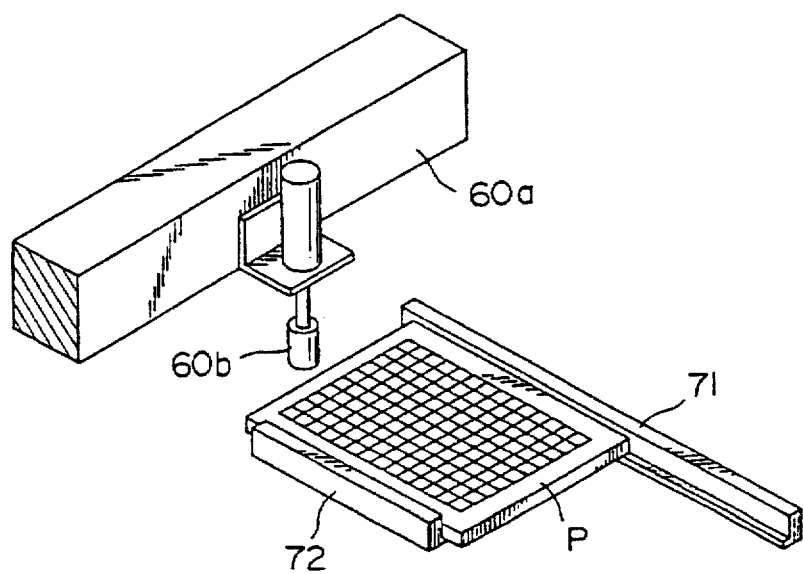
Figure 15:
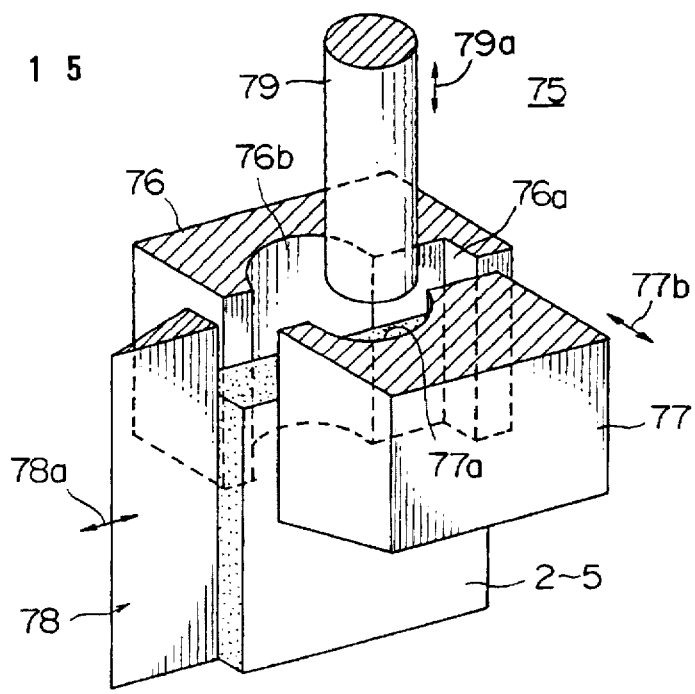
Figure 16A:
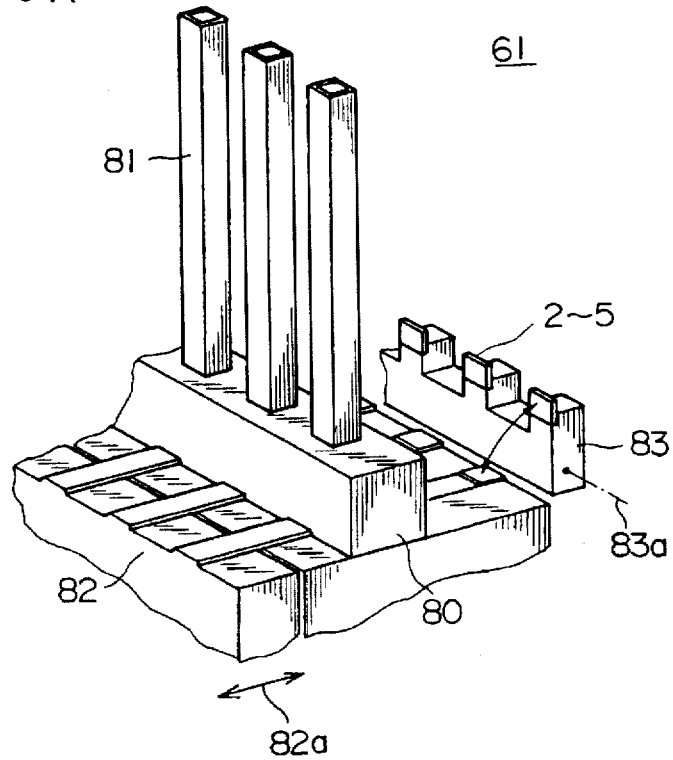
Figure 16B:
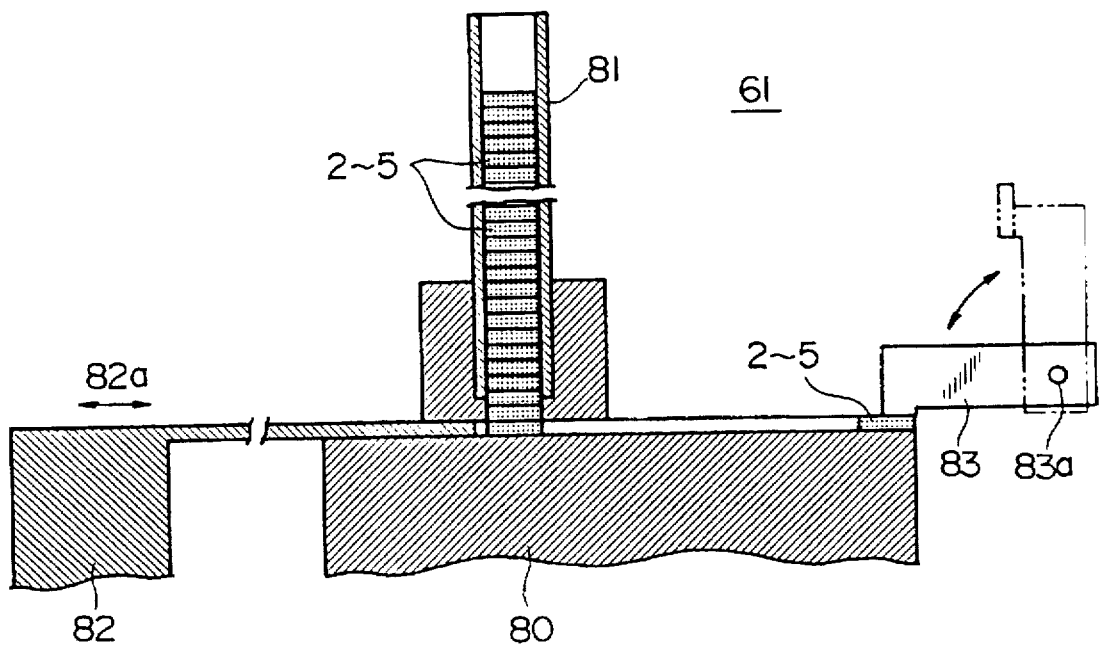
Figure 17:
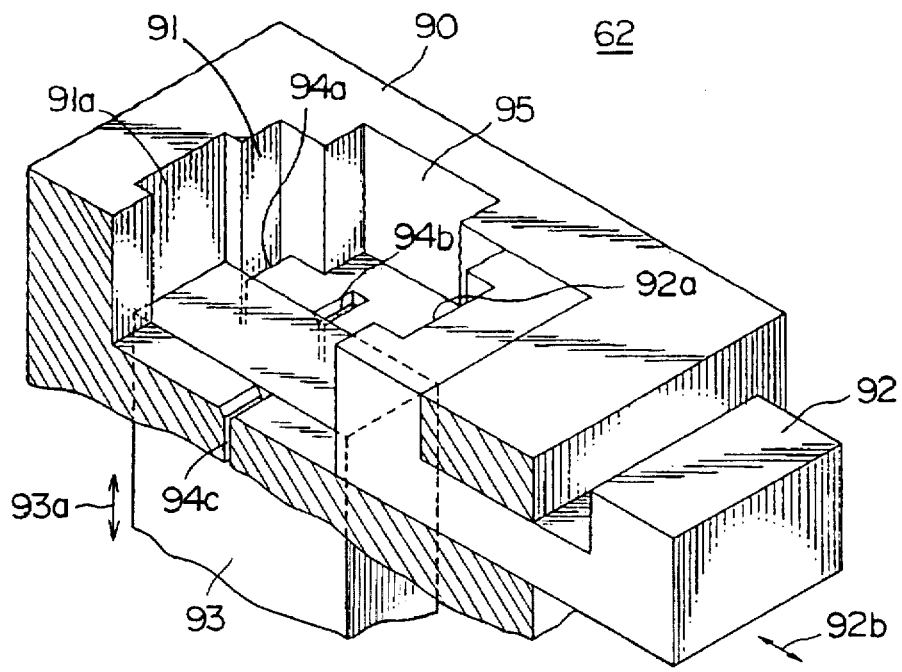
Figure 18:
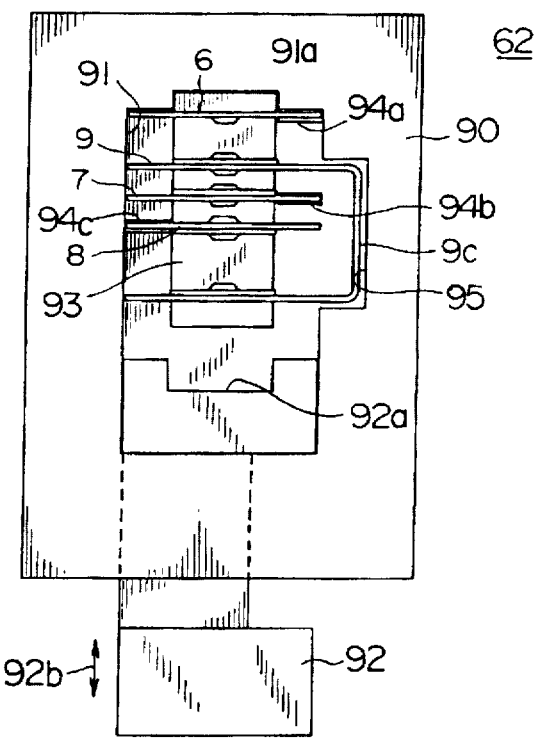
Figure 19:
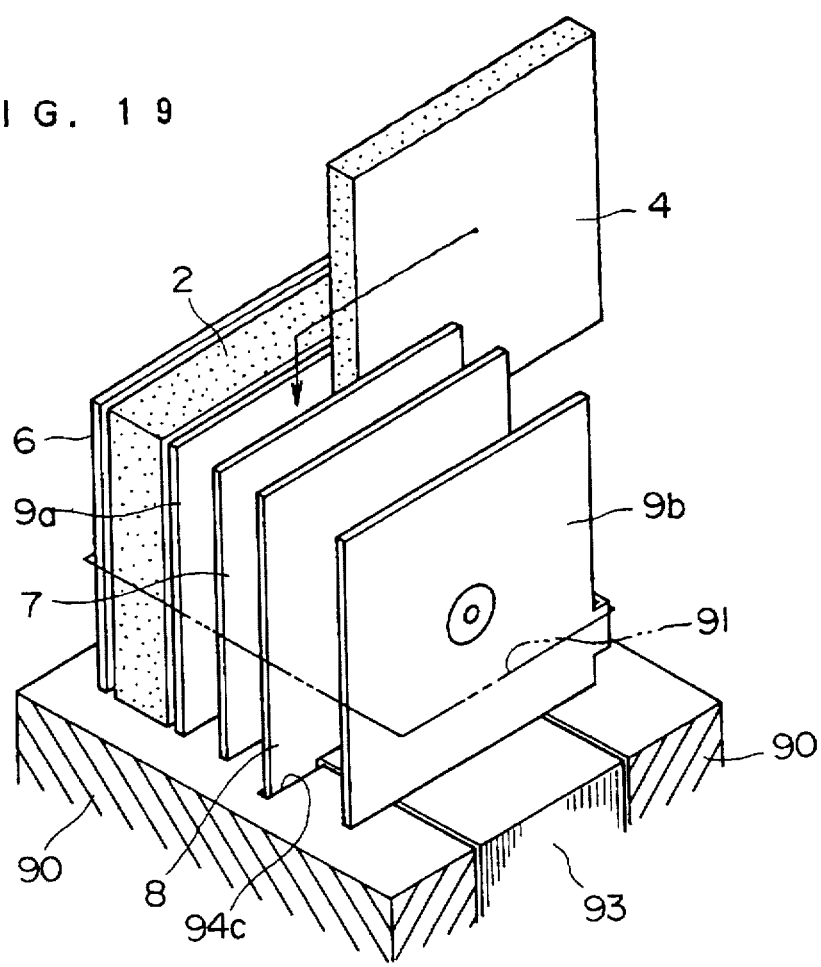
Figure 20A:
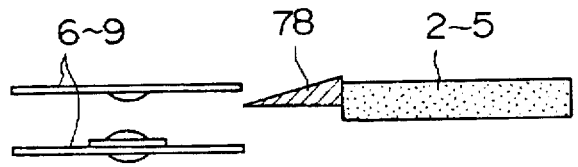
Figure 20B:
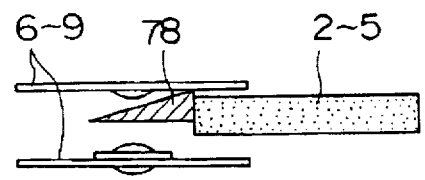
Figure 21A:
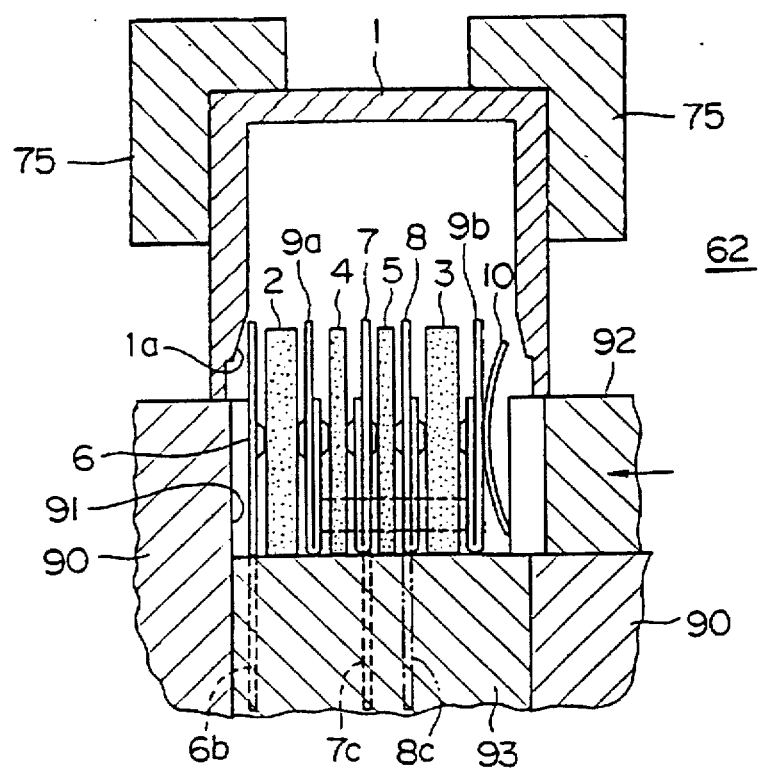
Figure 21B:
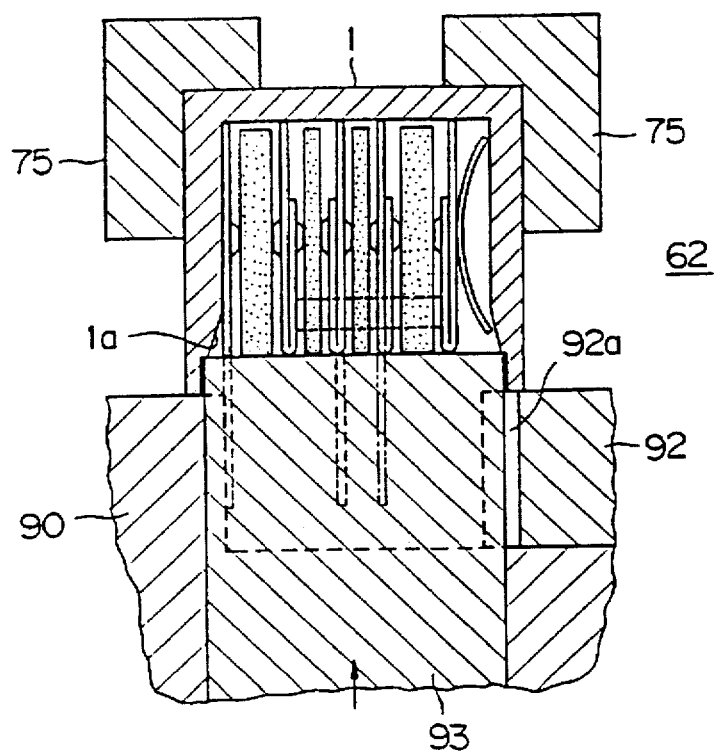
Figure 22:
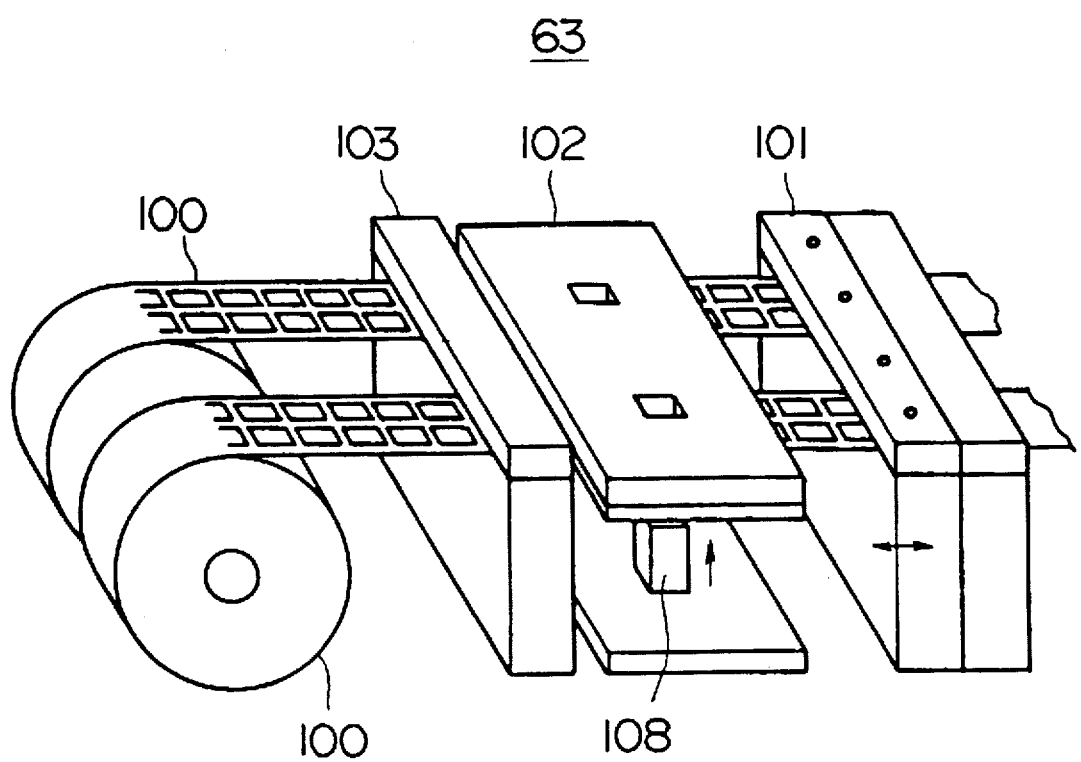
Figure 23:
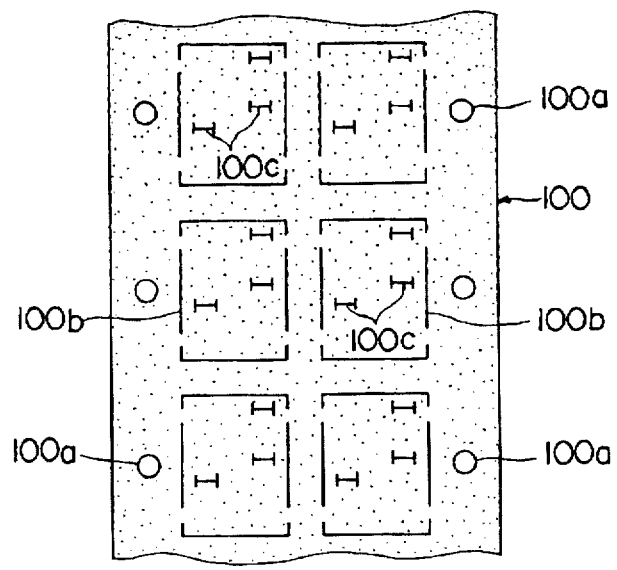
Figure 24:
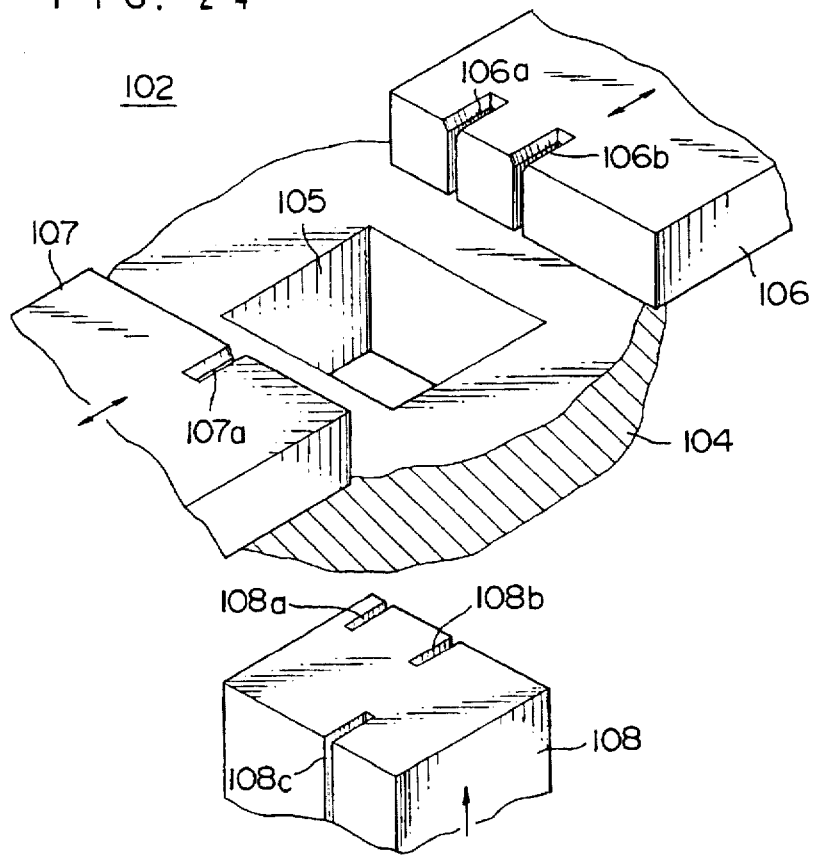
Figure 25A:
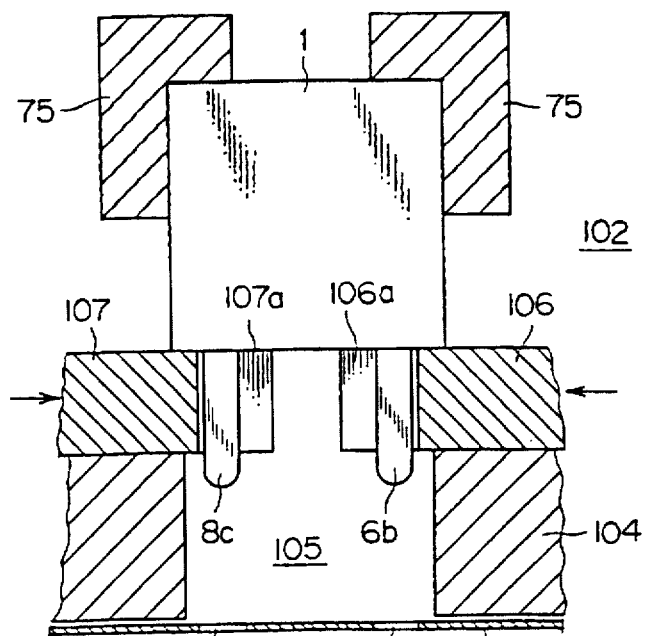
Figure 25B:
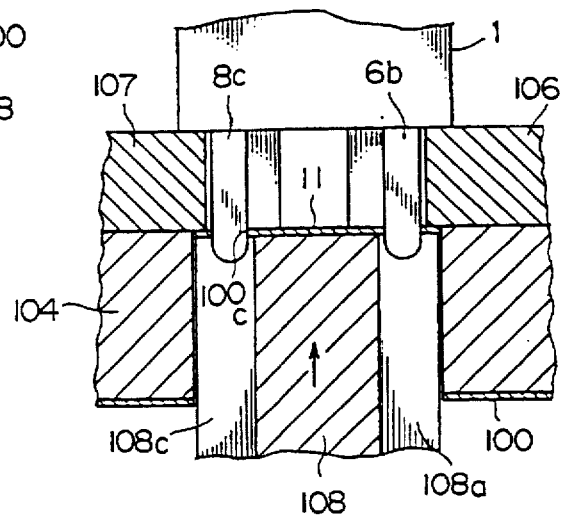
Figure 25C:
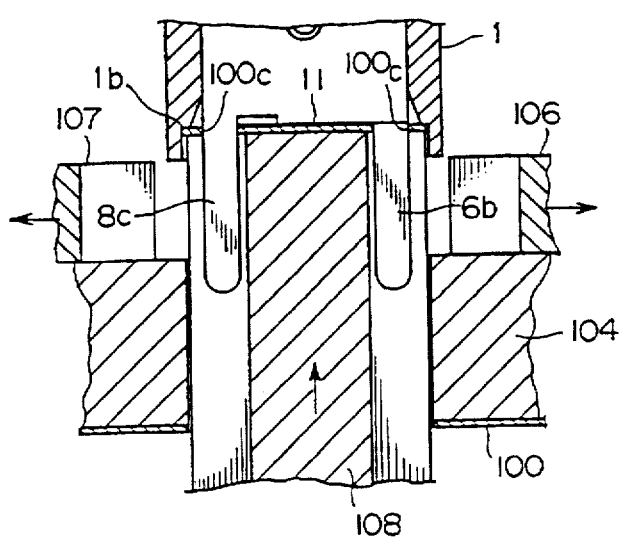
Figure 26:
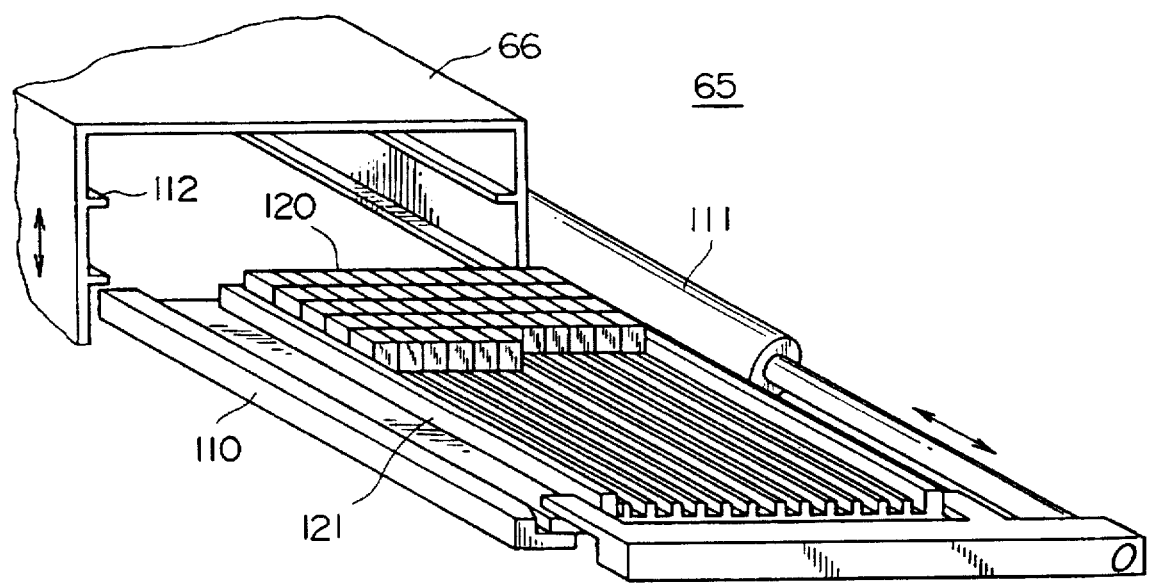

FIG. 12 is a perspective view showing a case supply section;

FIG. 13 is a plan view showing an assembly center;

FIG. 14A is a sectional view taken along the line XIV—XIV in FIG. 13;

FIG. 14B is a perspective view showing a pusher for pushing a pallet;

FIG. 15 is a perspective view showing a chuck hand;

FIG. 16A is a perspective view showing an element-supply unit;

FIG. 16B is a sectional view showing an element-supply unit shown in FIG. 16A;

FIG. 17 is a perspective view showing an assembly jig;

FIG. 18 is a plan view of the assembly jig shown in FIG. 17;

FIG. 19 is a perspective view showing an operation for inserting a resonator between terminals;

FIGS. 20A and 20B are plan views showing the operation for inserting a resonator between terminals;

FIGS. 21A and 21B are sectional views showing an operation for inserting parts in a case;

FIG. 22 is a perspective view showing a cover sheet assembling unit;

FIG. 23 is a plan view showing a paper tape;

FIG. 24 is a perspective view showing an essential part of a punching unit;

FIGS. 25A–25C are sectional views showing an operation of the punching unit; and FIG. 26 is a perspective view showing a discharge unit.

DESCRIPTION OF PREFERRED EMBODIMENTS

Figure 1:
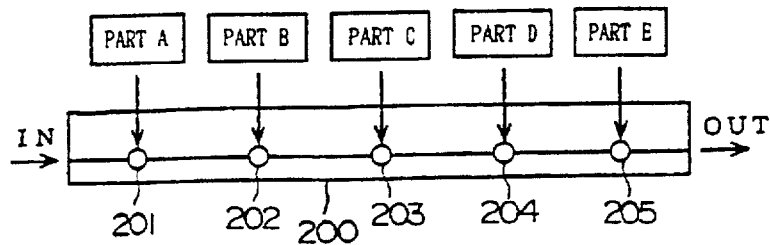
FIG. 1 is a schematic plan view of a conventional line type assembly system.
Figure 2:
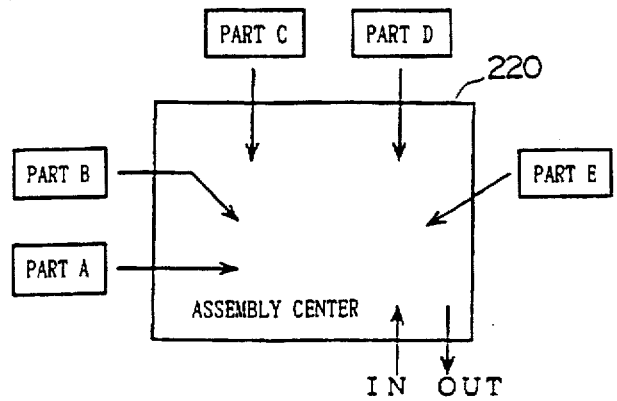
FIG. 2 is a schematic plan view of a conventional assembly center system.
Figure 3:
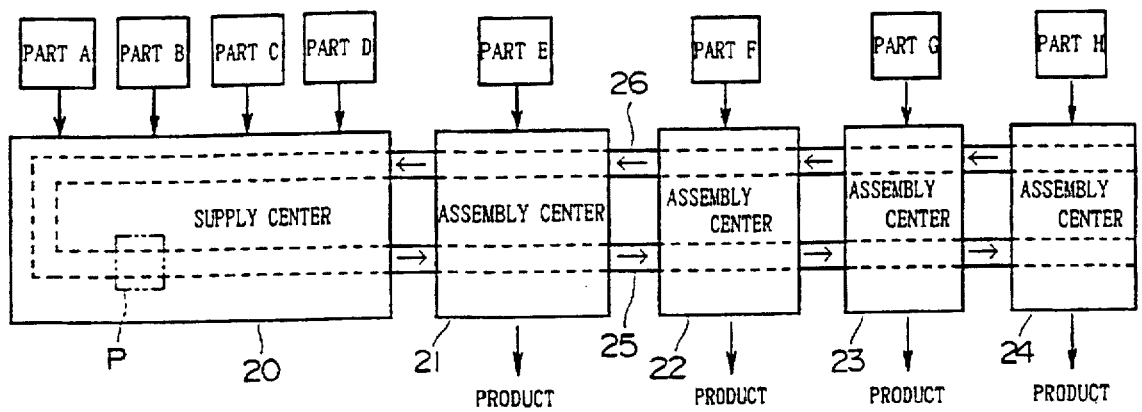
FIG. 3 is a schematic plan view of an assembly system according to a preferred embodiment of the present invention.

FIG. 3 shows an assembly system according to a preferred embodiment of the present invention.

This assembly system comprises a supply center 20, a plurality of assembly centers 21–24, a carrier conveyor 25 and a return conveyor 26.

The supply center 20 receives parts A–D from a supply unit such as a part feeder and inserts these parts A–D into a pallet P, which is used as a supply jig, in an aligned manner. The pallet P as described later is provided with a number of holding portions $P_1$–$P_6$ for holding and positioning a plurality of parts one by one.

The pallet P receiving the parts A–D from the supply center 20 is placed on the carrier conveyor 25, to be carried to one of the assembly centers 21–24. Each of the assembly centers 21–24 is arranged in the carriage direction of the carrier conveyor 25, to lift the pallet P from the conveyor 25 and hold the pallet P in a constant position therein. The parts A–D are removed from the pallet P by a chuck unit or the like which is provided in each of the assembly centers 21–24. At this time, since the parts A–D are positioned in the holding portions of the pallet P one by one, the parts A–D can be easily taken out by the chuck unit with a simple positioning mechanism. Non-common parts E–H are supplied to the assembly centers 21–24, respectively. Thus, each of the assembly centers 21–24 assembles the common parts A–D together with at least one of the non-common parts E–H into a product such as a ladder-type filter.

Products which are completely assembled at the assembly centers 21–24 are discharged therefrom, while the newly vacated pallet P is returned to the supply center 20 by the return conveyor 26.

4

Figure 4:
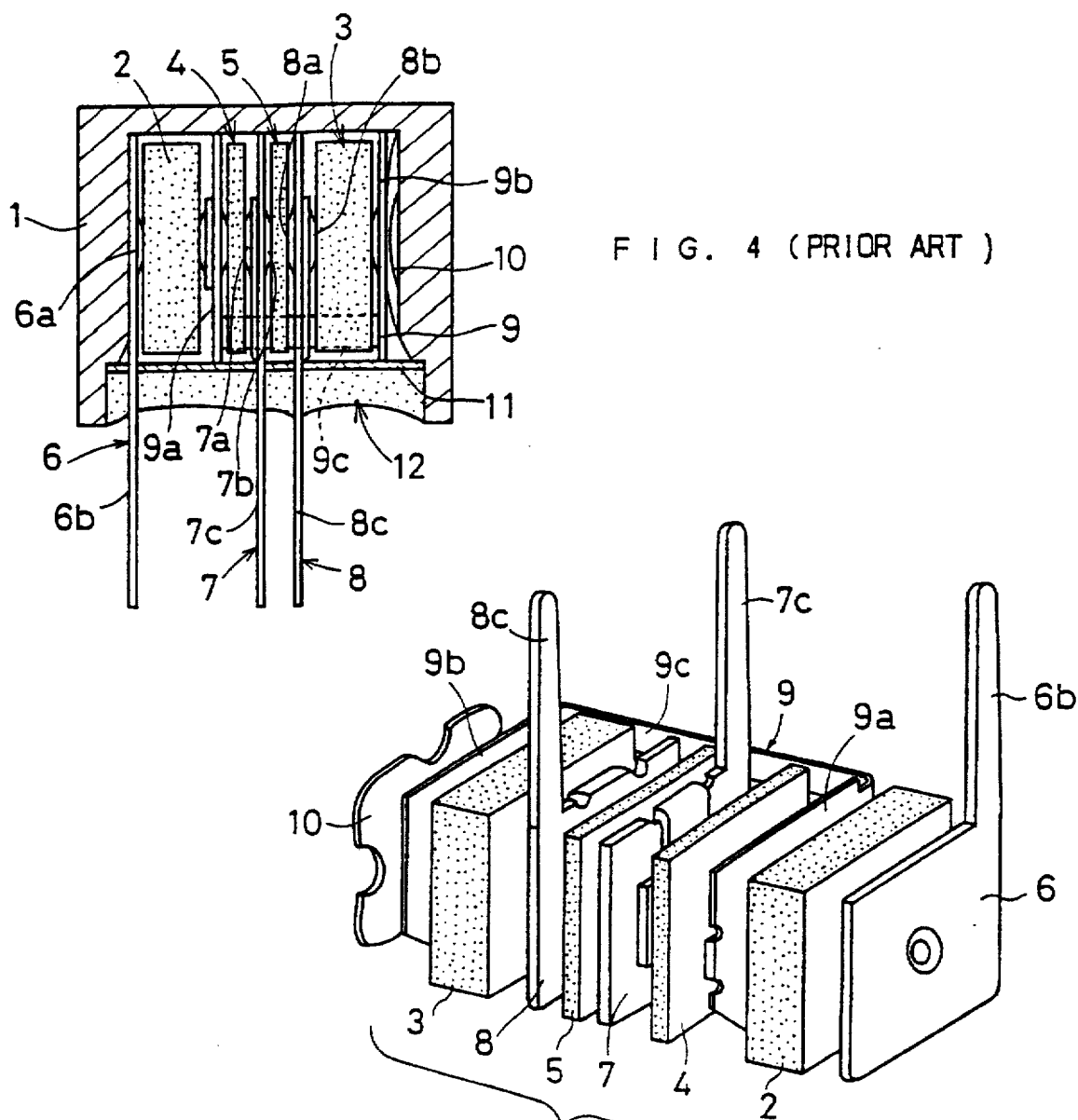
FIG. 4 is a sectional view of a known four-element ladder-type filter.
Figure 5:
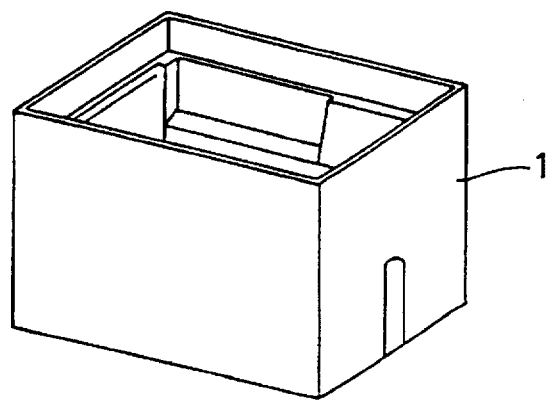
FIG. 5 is an exploded perspective view of the filter shown in FIG. 4.

A concrete example of the preferred embodiments of the present invention which is applied to assemble a conventional ladder-type filter as shown in FIGS. 4 and 5 will now be described.

Figure 6:
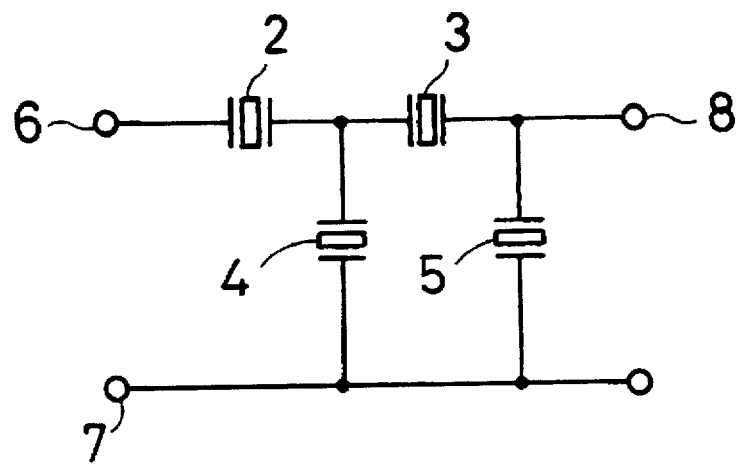
FIG. 6 is an electric circuit diagram of the filter shown in FIG. 4.

This filter comprises two series ceramic resonators 2 and 3, two parallel ceramic resonators 4 and 5, an input terminal plate 6, a ground terminal plate 7, an output terminal plate 8, an internal connection terminal plate 9 and a plate spring 10, which are stored in a box-type case 1. FIG. 6 is a circuit diagram showing the electrical connection thereof.

The input terminal plate 6 is provided on its one major surface with a protruding portion 6a which is in pressure contact with a central portion of the series resonator 2. The ground terminal plate 7 is provided on its both major surfaces with protruding portions 7a and 7b which are in pressure contact with central portions of the two parallel resonators 4 and 5, respectively. The output terminal plate 8 is provided on its both major surfaces with protruding portions 8a and 8b which are in pressure contact with central portions of the parallel resonator 5 and series resonator 3 respectively. The internal connection terminal plate 9 has a portion 9a which is inserted between the series resonator 2 and parallel resonator 4, a portion 9b which is arranged next to an outer major surface of the series resonator 3, and a coupling portion 9c which connects these portions 9a and 9b. Since the plate spring 10 is interposed between the portion 9b and an inner side surface of the case 1, the terminals 6–9 and the resonators 2–5 are in pressure contact with each other to be electrically connected.

A cover sheet 11 is inserted in an opening of the case 1, and a cavity which is defined by the cover sheet 11 and the opening is filled up with filler 12 such as resin, whereby the opening of the case 1 is sealed. Lead portions 6b, 7c and 8c of the input terminal 6, the ground terminal 7 and the output terminal 8 protrude from the opening of the case 1.

Figure 7:
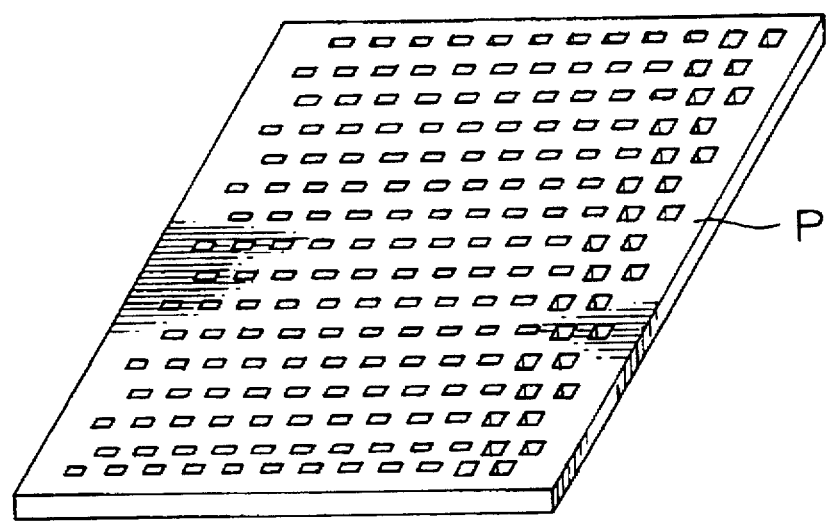
FIG. 7 is a perspective view showing a pallet.
Figure 8:
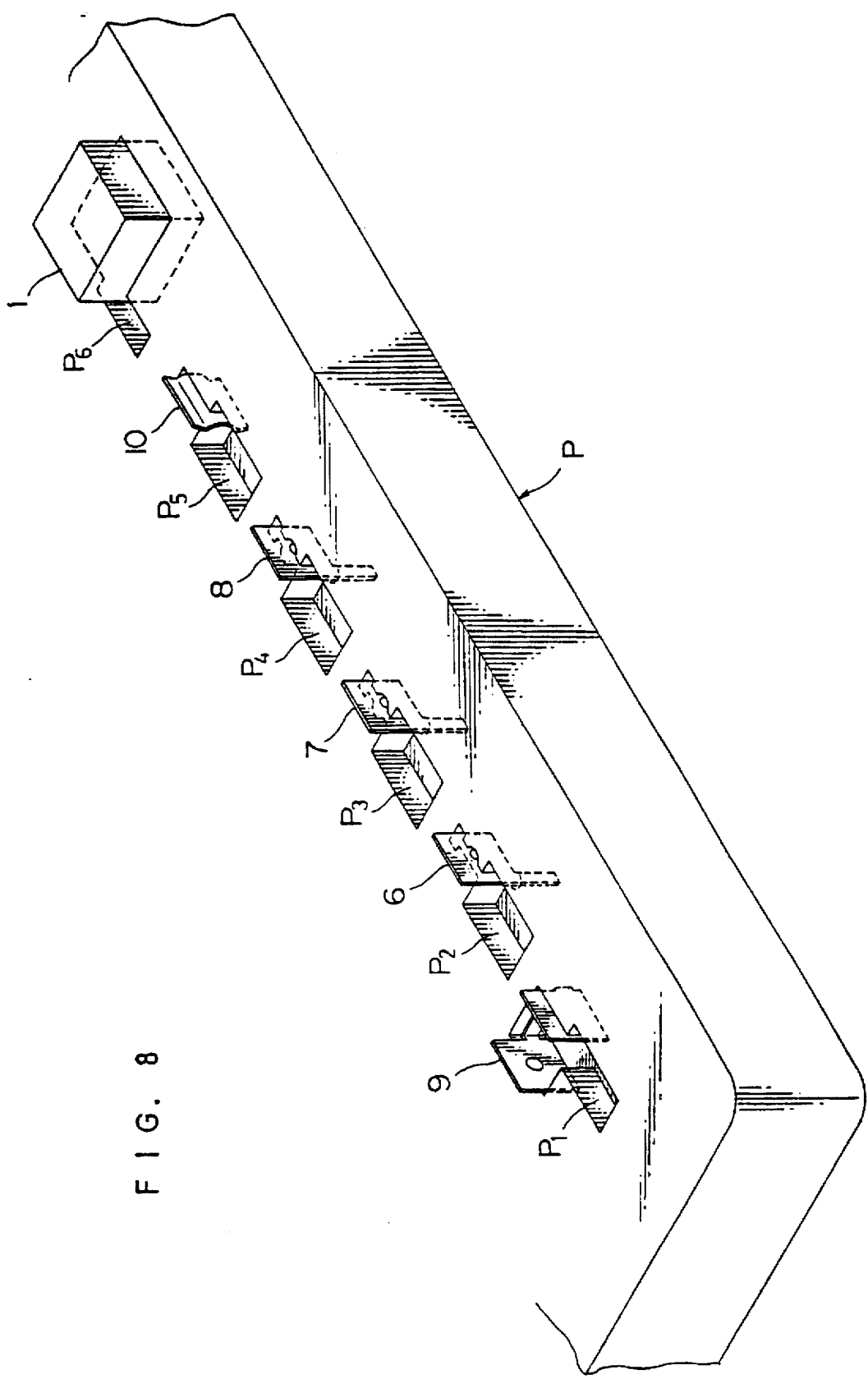
FIG. 8 is a partially enlarged perspective view of the pallet shown in FIG. 7.

As shown in FIGS. 7 and 8, the pallet P is a plate which comprises a number of cavities $P_1$–$P_6$ formed on an upper surface thereof for receiving respective parts 1 and 6–10 one by one in an aligned manner. The internal connection terminal plate 9, the input terminal plate 6, the ground terminal plate 7, the output terminal plate 8, the plate spring 10 and the case 1 are vertically held in the cavities $P_1$–$P_6$ respectively. The upper halves of the parts 1 and 6–10 protrude from the upper surface of the pallet P so that these parts can be easily chucked by a chuck hand provided in the assembly centers 21–24 as described later.

FIGS. 9A and 9B show the supply center 20. The supply center 20 is provided with the carrier conveyor 25 and the return conveyor 26, such as belt conveyors, in parallel with each other. A transfer conveyor 27 is perpendicularly provided between a beginning end portion of the carrier conveyor 25 and a terminating end portion of the return conveyor 26. Also, turn tables 28 and 29 are provided on intersections between the transfer conveyor 27 and the carrier and return conveyors 25 and 26 for rotating the pallet P by 90 degrees. Therefore, the pallet P returned by the return conveyor 26 is carried to the carrier conveyor 25 by the turn tables 28 and 29 and the transfer conveyor 27.

Six linear actuators 30–35 are arranged above the carrier conveyor 25 in parallel with each other, perpendicularly to the carriage direction. These actuators 30–35 are provided with chuck hands 30a–35a for removing the parts in pairs from supply sections 36–41 and inserting the parts into the pallet P simultaneously in an aligned manner. At this time, the pallet P on the conveyor 25 is stopped at positions corresponding to the actuators 30–35 respectively, as shown by two-dot chain lines in FIG. 9A.

Figure 10:
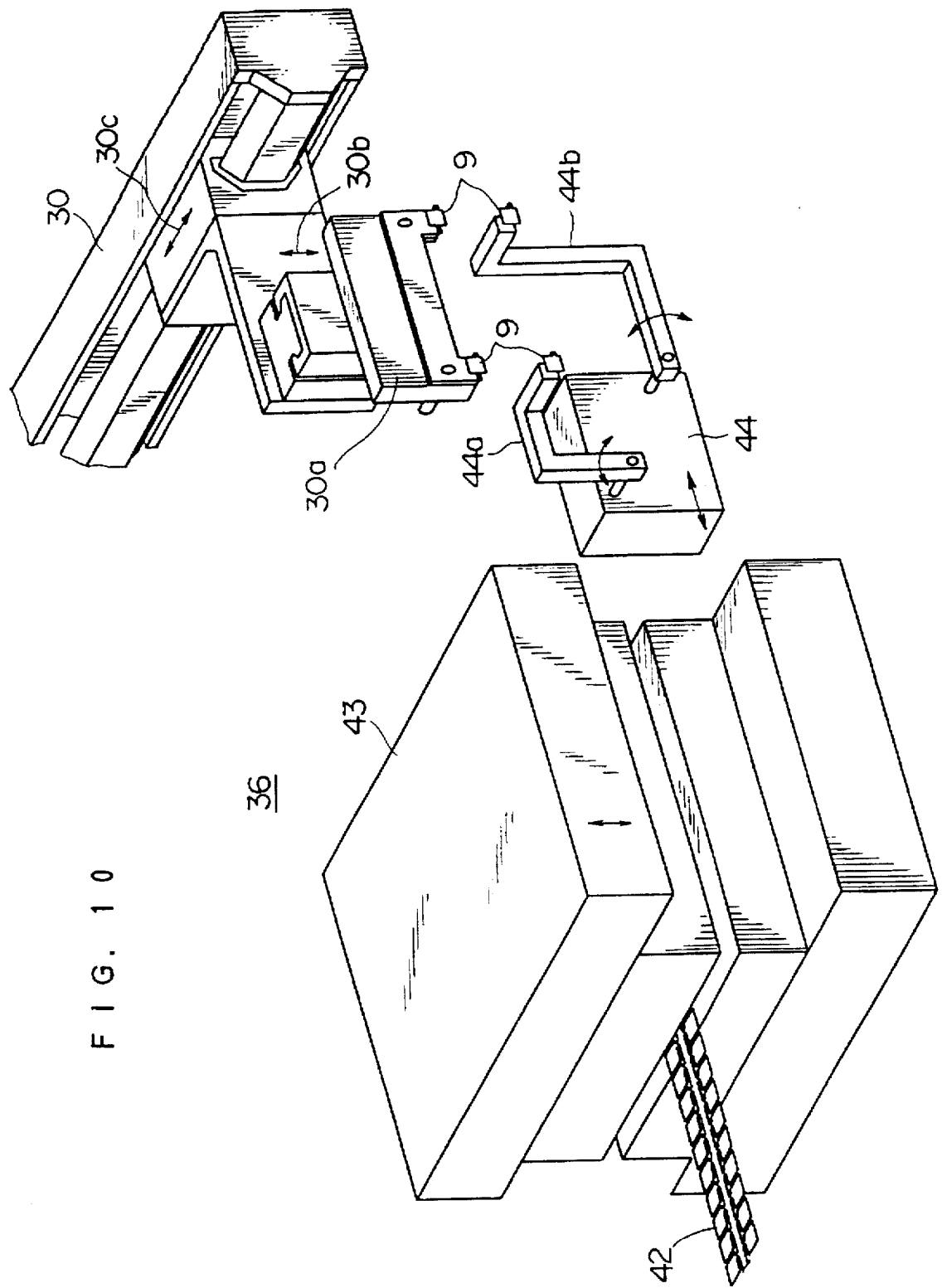
FIG. 10 is a perspective view showing an internal connection terminal supply section.

As shown in FIG. 10, the section 36 for supplying the internal connection terminals 9 comprises a forming die 43 and a discharge unit 44. The forming die 43 forms hoop-type lead frames 42 which are wound on a reel 36a into the U-shaped internal connection terminals 9, and the discharge unit 44 having two suction chucks 44a and 44b removed the terminals 9 in pairs from the forming die 43. When the terminals 9 are taken out by the chucks 44a and 44b, the terminals 9 are rotated by 90 degrees so that the space between each pair of the terminals 9 is defined in response to the chuck hand 30a. The chuck hand 30a simultaneously chucking each pair of the terminals 9 is upwardly moved along arrow 30b, and thereafter moved along arrow 30c to successively insert the terminals 9 into the pallet P.

Figure 11:
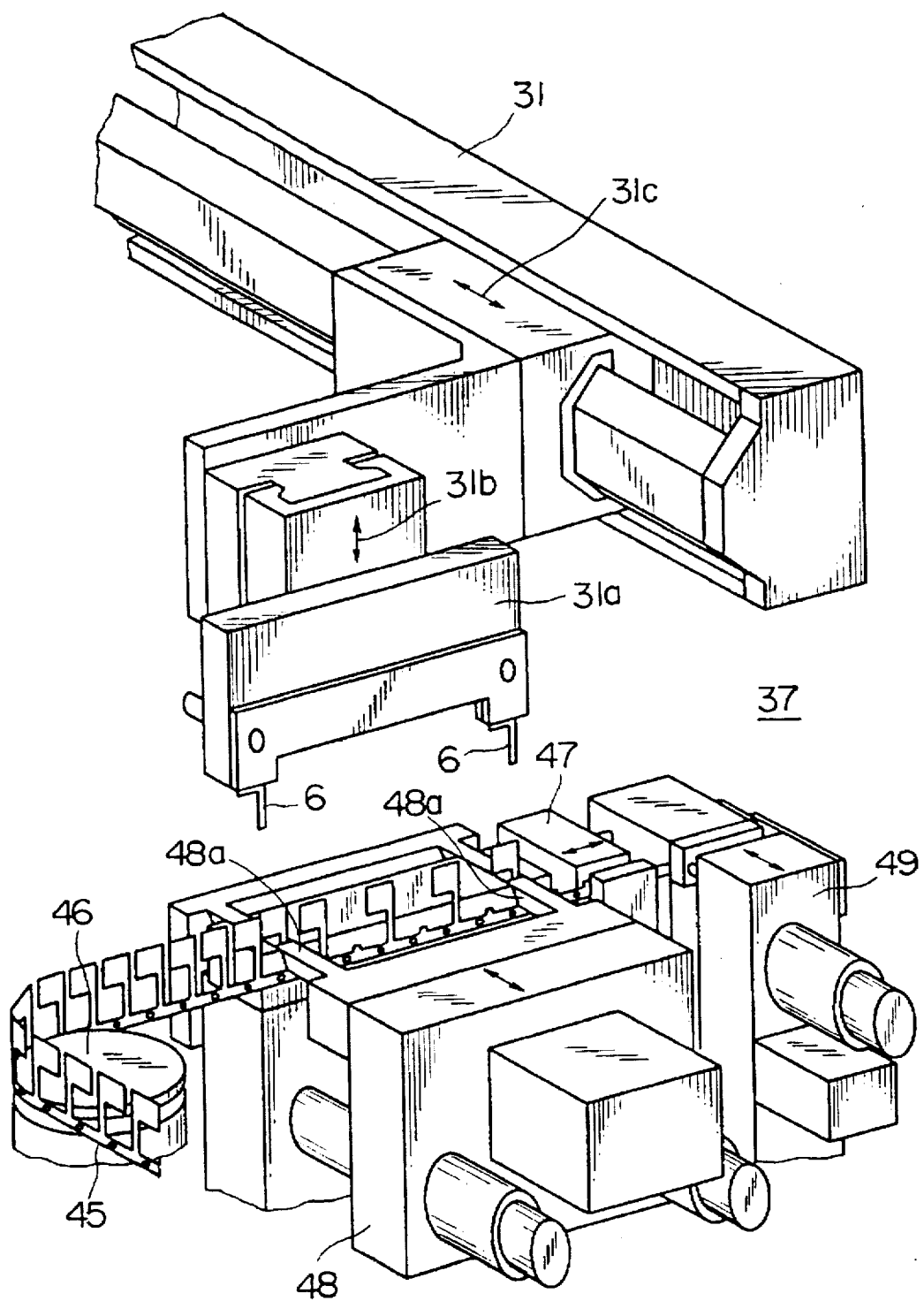
FIG. 11 is a perspective view showing an input terminal supply section.

As shown in FIG. 11, the section 37 for supplying the input terminals 6 pitchwisely feeds hoop-type lead frame 45 wound on a reel 37a by a feeder 47 while supplying tension thereto by a brake roller 46. A cutter 48 is arranged between the brake roller 46 and the feeder 47 so as to cut the lead frame 45 into pairs of the input terminals 6 with its cutting blades 48a. The chuck hand 31a simultaneously chucking each pair of the as-cut input terminals 6 is moved along arrows 31b and 31c so as to successively insert the terminals 6 into the pallet P. A tie-bar cutter 49 cuts the tie-bar of the lead frame 45 into scrap metal, so that the scrap metal is taken out from the section 37. Protective tape (not shown) which was wound together with the lead frame 45 on the reel 37a for protecting the terminals 6 is taken up by another reel 37b.

The sections 38, 39 and 40 for supplying the ground terminals 7, the output terminals 8 and the plate springs 10 are identical in structure to the section 37, and hence redundant description is omitted.

The section 41 is adapted to supply the cases 1. The cases 1 are continuously supplied from a ball feeder 50 to a linear feeder 51 along an arrow 51a and transferred onto an escape unit 52 which is reciprocated by a cylinder 52a, as shown in FIG. 12. Thus, each pair of the cases 1 are arranged with a constant space therebetween so that the chuck hand 35 can take up each pair of the cases 1 from the escape unit 52 simultaneously. Then, the chuck hand 35 inserts the cases 1 into the pallet P.

The pallet P having received the common parts 1 and 6–10 is carried to the assembly centers 21–24 by the conveyor 25.

As shown in FIG. 13, the assembly center 21 is provided with an X-Y robot 60, an element-supply unit 61 for supplying the resonators 2–5 as non-common parts, an assembly jig 62, a cover sheet assembly unit 63 for assembling cover sheets, an NG detecting unit 64 for detecting defectives, a discharge unit 65 for introducing a discharge jig 121 having assembled products 120 into a container 66 see FIG. 26), and a discharge conveyor 67 for discharging the container 66.

The X-Y robot 60 has an arm 60a being movable in a direction Y and a chuck hand 75 being movable along the arm 60a in a direction X. Therefore, the chuck hand 75 is freely movable in a working area S shown by slant lines. A pallet P holding the parts 1 and 6–10 is first conveyed into the working area S by the conveyor 25 as shown by an arrow, and then lifted up from the conveyor 25 by a lifter 70. Next, the pallet P is pushed by a movable rail 72 against a fixed rail 71 so as to be located at a constant position as shown in FIG. 14A. At this position, the parts 1 and 6–10 are taken out from the pallet P by the chuck hand 75. After all of the parts are removed from the pallet P, a pusher 60b which is provided on the arm 60a of the robot 60 comes down and pushes a rear end of the vacated pallet P along the rails 71 and 72 as shown in FIG. 14B. At this time, one side of the pallet P is transferred from the movable rail 72 onto a fixed rail 73. After the pallet P is further pushed along the rails 71 and 73 by the pusher 60b, the pallet P is transferred onto this lifter 74 provided on terminating ends of the rails 71 and 73. And then, the pallet P is brought down by the lifter 74 so as to be placed on a return conveyor 26 and is returned to the supply center 20 by the conveyor 26.

The respective sections of the assembly center 21 are now described in detail.

As shown in FIG. 15, the chuck hand 75 of the robot 60 comprises a fixed pawl 76 for holding one major surface of each part such as the resonator, the terminal plate or the case, a first movable pawl 77 which moves in the direction 77b for holding the other major surface of each part, a second movable pawl 78 which moves in the direction 78a perpendicular to the direction 77b, and an insertion pusher 79 which is movable in the vertical direction 79a. The fixed pawl 76 is provided with a stopper surface 76a for positioning a rear edge of each part, and a vertical groove 76b. The first movable pawl 77 is also provided on its inner surface with a vertical groove 77a corresponding to the groove 76b. The second movable pawl 78, which is used to push a front edge of each part against the stopper surface 76a of the fixed pawl 76 for correctly positioning the part, has a wedge-shaped cross-sectional surface. The second movable pawl 78, which extends downwardly beyond the pawls 76 and 77, also serves as a guide for inserting the resonators 2–5 between the terminal plates 6–9, as hereinafter described. The pusher 79 is used to downwardly push each part, which is chucked by the three pawls 76, 77 and 78. The pusher 79 will not interfere with the pawls 76 and 77 since the pusher 79 can pass through a void space which is defined between the grooves 76b and 77a.

As shown in FIGS. 16A and 16B, the element-supply unit 61 comprises a body 80 and a plurality of cassettes 81 which stand uprightly on the body 80, and a pusher 82 which moves in the direction 82a. A number of resonators 2–5 of the same type are stacked in each of the cassettes 81. First, resonators 2–5 come down from lower ends of the cassettes 81 in front of the pusher 82, and then are pushed forwardly one by one by the pusher 82 to the forward end of the body 80. Next, the resonators 2–5 are sucked by a vacuum suction member 83 so as to be upwardly rotated about an axis 83a by about 90 degrees. Thereafter, the resonators 2–5 are chucked by the chuck hand 75, and carried into the assembly jig 62. When the cassettes 81 are vacated, they can be easily exchanged by new ones.

As shown in FIGS. 17 and 18, the assembly jig 32 is provided with a base 90 having a cavity 91 for receiving parts, and a presser 92 which is movable in a horizontal direction 92b is arranged on one end of the cavity 91. The depth of the cavity 91 is preferably set to be longer than half of the heights of the resonators 2–5 and the terminals 6–10 and shorter than the heights thereof, so that these parts are partially upwardly projected from the cavity 91. An ejector 93 for upwardly thrusting the parts in a direction 93a is arranged at a central portion of a bottom of the cavity 91. Guide grooves 91a and 92a are formed in opposite surfaces of the cavity 91 and the pusher 92, for guiding both side portions of the ejector member 93. Lead portion receiving holes 94a–94c having tapered openings at their tops are vertically formed on the bottom of the cavity 91 beside the ejector 93. When lead portions 6b, 7c and 8c of the terminals 6–8 are inserted in the holes 94a–94c respectively, the terminals 6–8 are held self-sustainably.

A positioning groove 95 is provided on one side surface of the cavity 91 to receive the coupling portion 9c of the internal connection terminal 9. The terminals 6–9 are located on constant positions by inner side surfaces of the cavity 91, the holes 94a–94c and the positioning groove 95.

An operation for assembling the respective parts in the assembly jig 62 is now described.

First, the terminals 6–9 which are taken out from the pallet P by the chuck hand 75 of the robot 60 are inserted in the cavity 91 of the assembly jig 62 (see FIG. 18). Then the resonators 2–5 which are carried from the element-supply unit 61 by the chuck hand 75 are inserted between the terminals 6–9 one by one. In particular, as shown in FIG. 19, the resonators 2–5 are laterally inserted between the terminals 6–9 along the upper surface of the base 90, and then the resonators 2–5 are downwardly pushed by the pusher 79 when they reach the position corresponding to the cavity 91. At this time, the terminals 6–9 which are already inserted in the assembly jig 62 self-sustainably may be slightly inclined or slanted so as to hinder the insertion of the resonators 2–5. However, since the second pawl 78 of the chuck hand 75 having a wedge-shaped section separates the terminals 6–9 from each other as shown in FIGS. 20A and 20B, it is possible to smoothly insert the resonators 2–5 between the terminals 6–9. When the resonators 2–5 are inserted, electrode surfaces thereof are not damaged since no compressive force acts between the terminals 5–9. After the resonators 2–5 are inserted in the aforementioned manner, the plate spring 10 is inserted in a clearance between the portion 9b of the terminal plate 9 and the presser 92.

After all parts are assembled in the cavity 91 of the assembly jig 62, the parts are sidewardly compressed by the presser 92 as shown in FIG. 21A, so that the overall thickness of the parts is smaller than the inner size of the case 1. Then, the case 1 is carried from the pallet P onto the assembly jig 62 by the chuck hand 75, and located on a position for covering all parts which are projected on the base 90. Then, the ejector 93 is upwardly moved as shown in FIG. 21B so as to simultaneously insert all parts in the case 1. At this time, the parts are smoothly inserted due to an inclined surface 1a which is formed in an opening of the case 1. Further, the electrode surfaces of the resonators 2–5 are not damaged since the resonators 2–5 are not in sliding contact with the terminals 6–9. After the parts are inserted in the case 1 in the aforementioned manner, the case 1 which is chucked by the chuck hand 75 is carried to the cover sheet assembly unit 63.

As shown in FIG. 22, the cover sheet assembly unit 63 comprises paper tapes 100 which are wound in the form of rolls, a feeder 101 which delivers the tapes 100 in a stepwise manner, a punching machine 102 which punches the tapes 100 into the cover sheets 11 and inserts each of the cover sheets 11 in the case 1, and a brake 103. The brake 103, arranged in front of the punching machine 102, prevents the tapes 100 from loosening. As shown in FIG. 23, each tape 100 is provided on both sides with pin holes 100a at regular intervals, and perforations 100b are provided in correspondence to the pin holes 100a to facilitate punching of the tapes 100. Three slits 100c are provided inside the perforations 100b for receiving the lead portions 6b, 7c and 8c of the terminals 6–8.

As shown in FIG. 24, the punching machine 102 comprises a die 104 having a die hole 105 whose outline corresponds to the perforations 100b, a pair of guide plates 106 and 107 which are horizontally slidable along the upper surface of the die 104, and a punch 108 which can pass through the die hole 105 of the die 104. Each tape 100 is supplied along the lower surface of the die 104. The guide plates 106 and 107 are provided at the forward ends thereof with grooves 106a 106b and 107a for holding the lead portions 6b, 7c and 8c of the terminals 6–8, thereby preventing the lead portions 6b, 7c and 8c from bending when they are inserted in the slits 100c. The punch 108 is also provided with grooves 108a–108c corresponding to the lead portions 6b, 7c and 8c on both side surfaces thereof.

The operation of the punching machine 102 is now described with reference to FIGS. 25A–25C.

As shown in FIG. 25A, the guide plates 106 and 107 are inwardly moved and the chuck hand 75 chucking the case 1 is downwardly moved to insert the lead portions 6b, 7c and 8c in the grooves 106a, 106b and 107a respectively.

Then, the punch 108 is upwardly moved to punch the tape 100 along the perforations 100b to obtain a cover sheet 11, and hold the cover sheet 11 by the guide plates 106 and 107 and the punch 108, as shown in FIG. 25B. At this time, forward ends of the lead portions 6b, 7c and 8c are inserted in the slits 100c of the cover sheet 11.

Then, the guide plates 106 and 107 are outwardly moved and the punch 108 is further upwardly moved as shown in FIG. 25C. Thus, the cover sheet 11 is upwardly slid along the lead portions 6b, 7c and 8c so as to be inserted in the opening of the case 1. The cover sheet 11 is assembled in the case 1 when an outer peripheral edge of the sheet 11 is stopped at a step portion 1b provided in the opening of the case 1.

After the resonators 2–5, the terminals 6–9, the plate spring 10 and the cover sheet 11 are assembled in the case 1 in the aforementioned manner, the assembled products 120 are arranged on the discharge jig 121 of the discharge unit 65 shown in FIG. 26. The discharge jig 121, which is slidable on rails 110, is inserted into the container 66 by a cylinder 111 so as to be placed on a rack 112. After one jig 121 is placed on a rack 112, the container 66 is vertically moved stepwisely so that the next jig 121 is placed on the next rack 112. The assembled products 120 stored in the container 66 are carried to a next sealing step, where the opening of each case 1 is sealed with resin 12 to obtain a final product.

The present invention is not restricted to the aforementioned preferred embodiment, but various modifications are available.

In place of the ladder-type filter, the preferred embodiment of the present invention is also applicable to another product which includes a plurality of parts, as a matter of course. When the preferred embodiment of the present invention is applied to a ladder-type filter, the plate spring can be replaced by a rubber plate as a cushion member. Also, the cushion member can be eliminated if at least one of the terminal plates is made of a bent spring plate. Further, the preferred embodiment present invention is also applicable to a two-element ladder-type filter or a ladder-type filter having five or more elements, in addition to the four-element ladder-type filter appearing in the aforementioned embodiment.

Although the pallet supplies the terminals, the plate springs and the cases as common parts and the element supply unit supplies the resonators as non-common parts in the aforementioned embodiment, the pallet may also supply the resonators.

Though cover sheets are punched out from a tape and simultaneously inserted in the cases in the aforementioned embodiment, individual cover sheets which are previously prepared may be inserted in the cases one by one. However, since the cover sheets are easily set at correct positions in the embodiment, assembling efficiency is much improved.

Although the preferred embodiment present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for assembling a plurality of different types of products, each of said type of products including at least one common part which is used in all of said types of products and one or more non-common parts which are unique to that type of product and is not used in the remaining said types of products, said common parts being different from said non-common parts, said method comprising the steps of:
- inserting said common parts into holding portions of a supply jig;
- moving said supply jig to a plurality of assembly centers, each of said assembly centers for assembling a respective one of said types of products such that each of said types of products is assembled at a different one of said assembly centers, each of said assembly centers having at least one supply member for supplying the non-common parts required for assembling, one of the types of products assembled by that assembly center such that each of said assembly centers supplies a unique set of non-common parts; and
- when the supply jig is located at an assembly center, removing said common parts from said supply jig, removing said non-common parts from said at least one supply member associated with that assembly center and assembling said removed common parts and said removed non-common parts in a predetermined cooperating relationship into the type of product assembled by such assembly center.

2. The method of claim 1, wherein the step of assembling said common and non-common parts comprises the steps of inserting said common parts in an assembly jig and then inserting said at least one non-common part in said assembly jig.

3. The method of claim 2, wherein the step of inserting said at least one non-common part in said assembly jig comprises the step of inserting said at least one non-common part between adjacent common parts contained in said assembly jig.

4. The method of claim 3, wherein the step of inserting said at least one non-common part in said assembly jig comprises the step of separating said adjacent common parts by inserting a wedge-shaped member therebetween so as to allow said at least one non-common part to be inserted between said adjacent common parts.

5. The method of claim 2, further comprising the step of pressing together said common parts and said non-common parts contained in the assembly jig to form a compact unit.

6. The method of claim 5, further comprising the step of inserting said compact unit into a case.

7. The method of claim 6, further comprising the step of sealing the case with a cover sheet and a sealing material.

8. The method of claim 1, wherein the supply jig is moved to only one of said plurality of assembly centers during assembly of each of said products.

9. The method of claim 1, wherein the step of moving said supply jig to one of a plurality of assembly centers includes the step of raising said supply jig from said carrier up to a level of said one of said plurality of assembly centers.

10. The method of claim 9, wherein the step of moving said supply jig to one of a plurality of assembly centers includes the step of aligning said supply jig against a stationary aligning member.

11. The method of claim 1, wherein the step of moving said supply jig to one of a plurality of assembly centers includes the step of moving said supply jig past a location of at least one of said assembly centers without said supply jig being located within said at least one assembly center.

12. The method of claim 1, further comprising the steps of discharging an assembled product from said one of said assembly centers and moving said supply jig back to a supply center for repeating the step of positioning said common parts in said holding portions of said supply jig for assembling another one of said plurality of different type products.

13. A method of assembling a plurality of groups of parts to form a plurality of different products, each of said groups of parts consisting of at least one common part included in each of the plurality of different products and at least one non-common part included in only one of said plurality of different products, said common and non-common parts being distinct from each other, said method comprising the steps of:
- obtaining a supply jig having a plurality of holding portions for holding a plurality of said common parts;
- locating said supply jig on a carrier for carrying said supply jig;
- inserting said common parts into said supply jig for assembling each of said plurality of different products;
- moving said carrier to move said supply jig to one of a plurality of assembly centers each provided for assembling a single type of said plurality of different products, each of said assembly centers being positioned above said carrier and each having at least one supply member for supplying at least one respective non-common part therein, said step of moving including the step of raising said supply jig from said carrier up to a level of said one of said plurality of assembly centers; and
- removing said common parts from said supply jig and removing said at least one non-common part from said at least one supply member of a respective one of said plurality of assembly centers and assembling said common and non-common parts into a respective single type product of said plurality of different type products.

14. The method of claim 13, wherein said step of assembling said common and non-common parts includes the steps of inserting said common parts into an assembly jig and then inserting said at least one non-common part into said assembly jig.

15. The method of claim 14, wherein the step of assembling said common and non-common parts includes the step of pressing said common and non-common parts together and inserting said common and non-common parts into a case member.

16. The method of claim 15, wherein the step of assembling said common and non-common parts further includes the step of sealing said case member after said common and non-common parts are inserted therein.

17. The method of claim 14, wherein the step of inserting said at least one non-common part in said assembly jig further comprises the step of inserting said at least one non-common part between adjacent common parts contained in said assembly jig.

18. The method of claim 17, wherein the step of inserting said at least one non-common part in said assembly jig further comprises the step of separating said adjacent common parts by inserting a wedge-shaped member therebetween so as to allow said at least one non-common part to be inserted between said adjacent common parts.

19. The method of claim 13, wherein the supply jig is moved to only one of said plurality of assembly centers during assembly of each of said products.

20. The method of claim 13, wherein the step of moving said supply jig to one of a plurality of assembly centers includes the step of moving said supply jig past a location of at least one of said assembly centers without said supply jig being located within said at least one assembly center.

* * * * *